US005555158A

United States Patent [19]
Dent

[11] Patent Number: 5,555,158
[45] Date of Patent: Sep. 10, 1996

[54] MOTHERBOARD FOR PERSONAL COMPUTER STANDARD DESKTOP CHASSIS

[75] Inventor: David Dent, Beaverton, Oreg.

[73] Assignee: Intel Corporation, Santa Clara, Calif.

[21] Appl. No.: 380,045

[22] Filed: Jan. 30, 1995

[51] Int. Cl.⁶ .............................. H05K 5/00; G06F 1/16
[52] U.S. Cl. ..................... 361/684; 361/683; 364/708.1
[58] Field of Search .................................... 361/683–686, 361/687, 679; 364/708.1; G06F 1/16

[56] References Cited

U.S. PATENT DOCUMENTS

| | | | |
|---|---|---|---|
| 4,479,198 | 10/1984 | Romano et al. | 364/708.1 |
| 5,036,481 | 7/1991 | Lunsford et al. | 364/708.1 |
| 5,214,572 | 5/1993 | Cosimano et al. | 439/61 |

FOREIGN PATENT DOCUMENTS

0460415A2  12/1991  European Pat. Off. .

*Primary Examiner*—Leo P. Picard
*Assistant Examiner*—Lynn D. Feild
*Attorney, Agent, or Firm*—Owen L. Lamb

[57] ABSTRACT

A computer mother board is housed in a chassis that has a number of expansion board guides along a back panel of the chassis and a power supply with a cooling fan. The mother board is rectangular with its short dimension being 8 inches and its long dimension being as 13 inches so that it fits into the chassis of existing computers. The motherboard is positioned in the chassis such that the long dimension is along the back panel of the chassis, which means that the motherboard is rotated 90 degrees from the orientation of conventional motherboards. The short dimension accommodates a number of expansion card connector sockets perpendicular to the long dimension such that the connector sockets are in alignment with the expansion board guides along the back panel of the chassis. A central processing unit socket is located near the power supply fan for more efficient cooling. Input/output connectors sockets are located along the long dimension such that the input/output connector sockets are in alignment with openings in the back panel.

22 Claims, 2 Drawing Sheets

MOTHERBOARD FOR PERSONAL COMPUTER STANDARD DESKTOP CHASSIS

BACKGROUND OF THE INVENTION

1. Field of the Invention

The present invention is related to personal computers and more particularly to an improved motherboard apparatus of a personal computer.

2. Background Art

A personal computer is a stand-alone desktop computer housed in a chassis which is a cover that protects the computer components from the environment and the environment from the computer, such as electromagnetic interference (EMI). Input/output (I/O) devices, such as a video monitor, mouse and printer are connected by means of cables that plug into connectors at a back panel of the chassis. Inside the chassis is a system board, called a motherboard, that holds the electronic components of the computer. Expansion add-in cards are inserted into up to eight connectors that are mounted directly on the motherboard. The motherboard has printed circuit wiring that distributes signals from the add-in cards to appropriate components on the motherboard via an expansion bus.

Today, two primary motherboard standards exist. The Baby AT (BAT), and the Low Profile expandable (LPX). BAT was established by IBM at the inception of the IBM personal computer AT (Advanced Technology). LPX was developed later by Western Digital.

The BAT motherboard dimensions are 8.6" by 13" and contains up to 8 vertical slots for expansion cards. The BAT motherboard has the advantage that it is very common, it is easy to insert add-in cards and the design places the central processing unit (CPU) module near the front of the chassis where it is cooled by incoming air. The BAT motherboard has the disadvantage that there is no expansion room for additional I/O connectors out the back of the motherboard. Also, the CPU and its heat sink, and single in-line memory modules (SIMMs) cut off full length expansion slots.

The LPX motherboard dimensions are 9' by 13' and contains 5 horizontal slots for expansion cards. The LPX motherboard has the advantage that it is common. I/O is integrated on the motherboard and easily goes out the back of the chassis and the CPU usually placed near the front of chassis where it is cooled by incoming air.

The LPX motherboard has the disadvantage that add-in cards are harder to install and a riser card is required in the center of the motherboard to support expansion slots. Also, the CPU and its heat sink, and the SIMMs cut off full length expansion slots.

It is therefore desirable to have an improved motherboard that results in lower total system cost and adds some new capabilities to keep up with increasing I/O needs of modern multimedia computers.

SUMMARY OF THE INVENTION

Briefly, the invention is concerned with a computer having a motherboard housed in a chassis. The chassis has a number of expansion board guides along a back panel and a power supply. The mother board has a first edge of a short dimension. A second edge is opposite the first edge. The mother board has a third edge of a long dimension, that is greater than the short dimension. The mother board accommodates a number of expansion card connector sockets perpendicular to the third edge along the long dimension such that the connector sockets are in alignment with guides along the back panel of the chassis. A central processing unit socket is located at the second edge near the power supply. Input/output connectors sockets are located along the third edge such that the input/output connector sockets are in alignment with the openings in the back panel when the mother board is installed in the chassis.

The invention has the advantage that the new mother board fits in a chassis that also accommodates either a BAT motherboard or an ATX motherboard.

The invention has the advantage that all slots on the mother board accommodate full length expansion cards.

The invention has the advantage that no I/O cables are required for standard features.

The invention has the advantage that a CPU heat sink can be tall and passive.

The invention has the advantage that the CPU is placed near a power supply fan for cool incoming air.

The invention has the advantage that the CPU and heat sink assembly does not cut off full length slots.

The invention has the advantage that the motherboard accommodates stacked connectors (e.g. stacked mouse & keyboard connectors).

The invention has the advantage that it saves on motherboard space and results in lower total system costs.

DESCRIPTION OF THE PREFERRED EMBODIMENT

Figure 1:
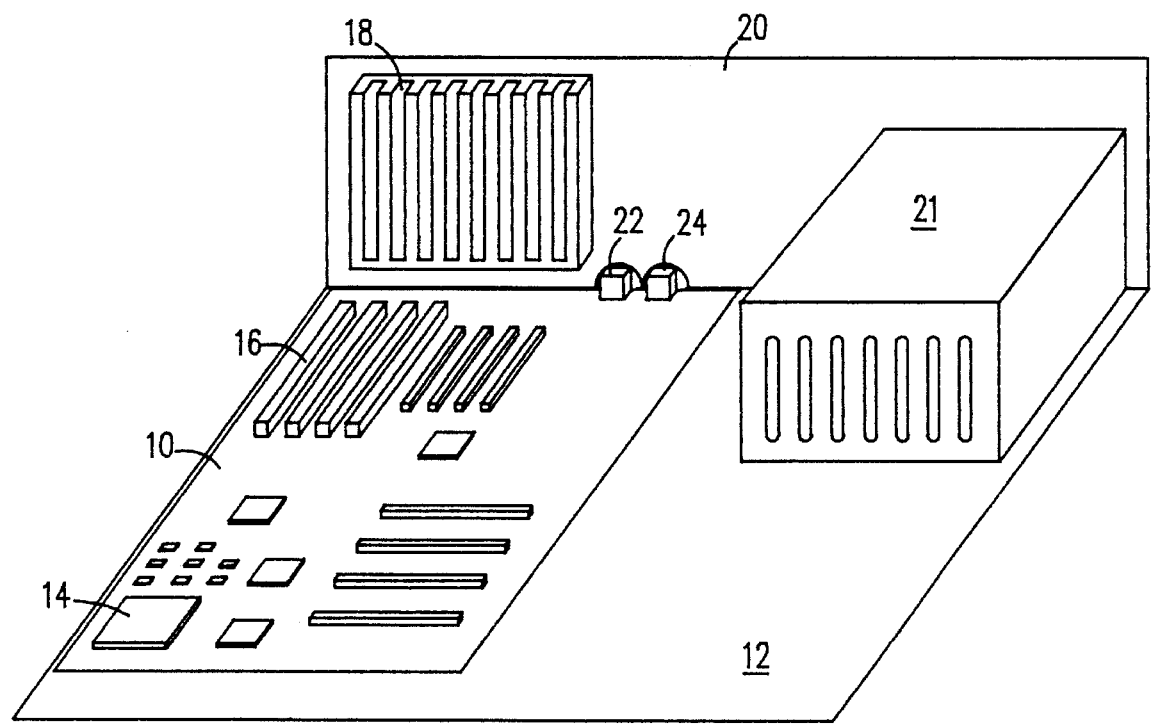
FIG. 1 is a perspective view of a prior art BAT computer system mother board.

Refer to FIG. 1 which is a perspective view of a prior art computer system. In the prior art, a large printed circuit board called a system board or Baby AT (BAT) motherboard (10), is fastened at the bottom of a computer chassis (12) and holds the computer's processor (14), control circuitry and other electronics. Eight expansion slots (16, 18) on the motherboard receive hardware options in the form of printed circuit cards that are plugged directly into one or more of the expansion slots. Each slot includes a connector, or socket (16) on the motherboard into which an expansion card is plugged. To hold the card rigidly in a vertical position each slot also has a card guide slot (18) on a chassis back panel (20). The chassis also houses a power supply (21) with a cooling fan.

Input/output (I/O) devices, such as a video monitor, mouse and printer are connected to the back panel of the chassis by means of cables that plug into connectors (22, 24) through access holes in the back panel (20) of the chassis.

The BAT motherboard of FIG. 1 is shown inserted into a typical chassis (12). The board dimensions are 8.6" by 13" and contains up to 8 vertical slots (18) for expansion cards. The BAT motherboard has the advantage that it is very common, it is easy to insert add-in cards and the design places the central processing unit (CPU) module near the front of the chassis where it is cooled by incoming air. The BAT motherboard has the disadvantage that there is no expansion room for I/O connectors out the back of the motherboard. Also, the CPU and its heat sink, and single in-line memory modules (SIMMs) cut off full length expansion slots. Also, the CPU is located away form the maximum cooling effect of the power supply.

Figure 2:
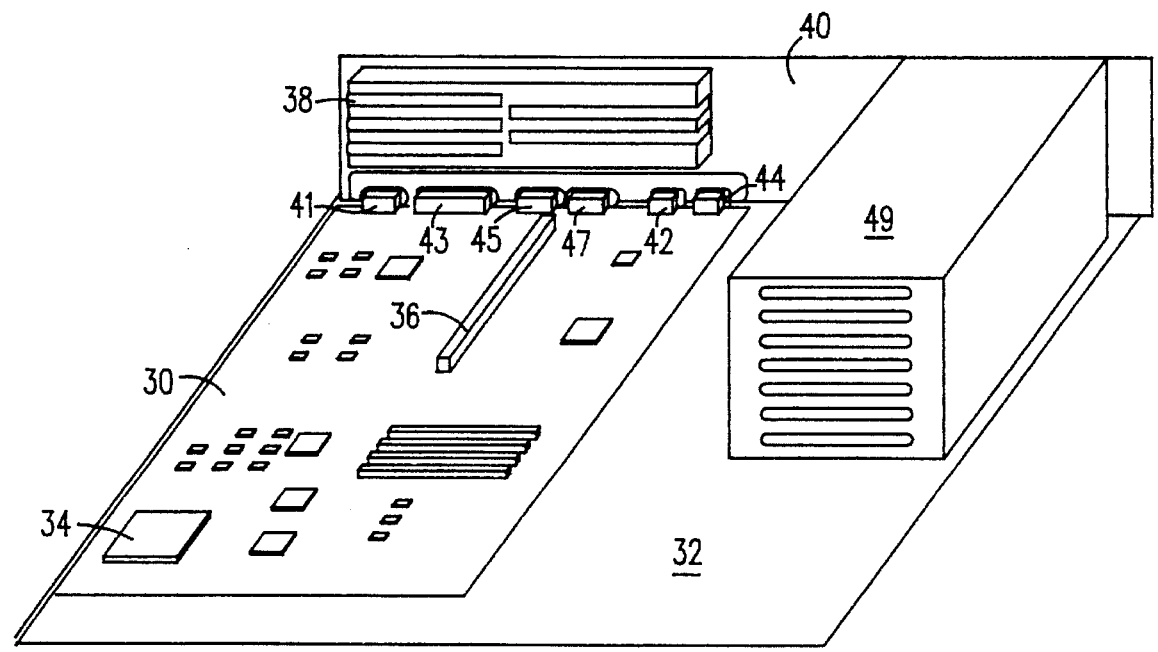
FIG. 2 is a perspective view of a prior art LPX computer system mother board; and, FIG. 3 is a perspective view of a computer system mother board of the present invention.

Refer to FIG. 2 which is a perspective view of another prior art computer system. In the prior art, an LPX motherboard (30), is fastened at the bottom of a computer chassis (32) and holds the computer's processor (34), control circuitry and other electronics. A single riser board socket (36) is soldered onto the motherboard. Five ISA 16-bit expansion slot connectors on the riser card (not shown) receive expansion cards that are plugged directly into one or more of the expansion slots on the riser board. Each slot includes a connector, or socket on the riser board into which an expansion card is plugged. To hold the card rigidly in a vertical position each slot also has a card guide slot (38) on a chassis back panel (40). The riser board is considered an extension of the motherboard.

Input/output (I/O) devices, such as a video monitor, mouse and printer are connected to the back panel (40) of the chassis by means of cables that plug into connectors (42, 44) through access holes in the back panel (40) of the chassis. The connectors include a video connector (41), parallel port connector (43), serial port 1 connector (45), serial port 2 connector (47), mouse connector (42), and keyboard connector (44). The chassis also houses a power supply (49) with a cooling fan.

The use of a horizontal configuration for expansion cards as compared with the vertical configuration shown in FIG. 1 results in more room for I/O connectors.

The LPX motherboard of FIG. 2 is shown inserted into a typical chassis. The motherboard dimensions are 9' by 13' and contains 5 horizontal slots for expansion cards.

The LPX motherboard has the advantage that it is common. I/O is integrated on the motherboard and easily goes out the back of the chassis (graphics, parallel, 2 serial, mouse and keyboard) and the CPU is usually placed near the front of chassis where it is cooled by incoming air.

The LPX motherboard has the disadvantage that add-in cards are harder to install and a riser card is required in the center of the motherboard to support expansion slots. Also, the CPU and its heat sink, and the single in-line memory modules (SIMMs) cut off full length expansion slots.

Figure 3:
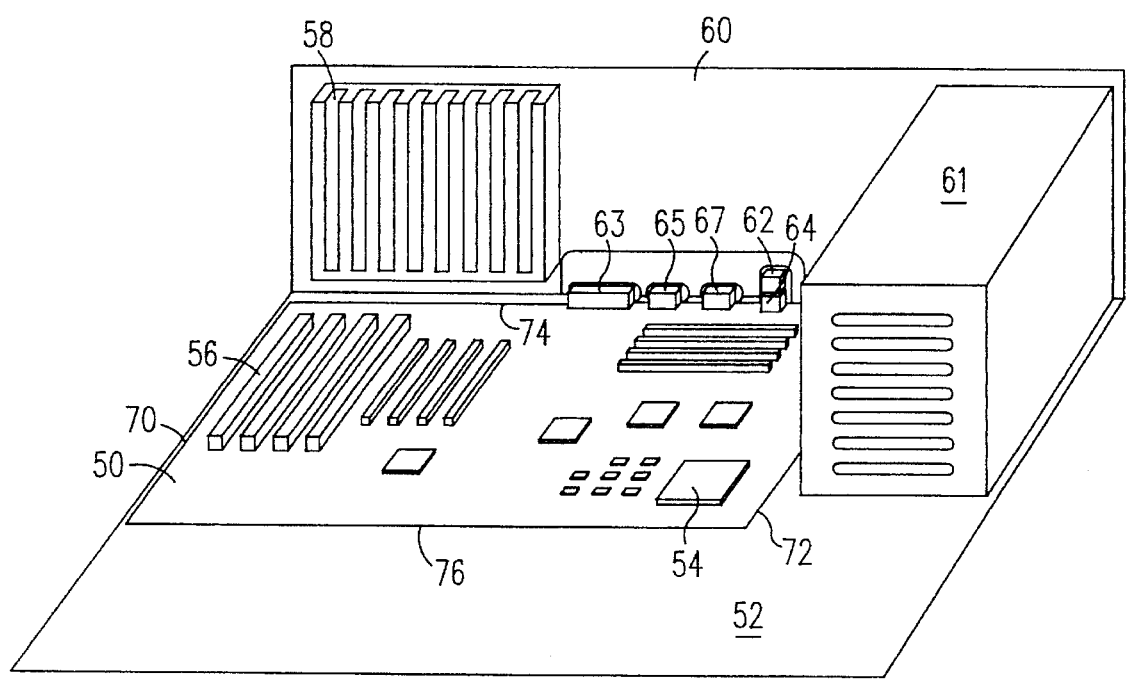

Refer to FIG. 3 which is a perspective view of a computer chassis and mother board in which the present invention is embodied. A motherboard (50), is fastened at the bottom of a computer chassis (52) and holds the computer's processor (54), control circuitry and other electronics. Eight expansion slots (56, 58) on the motherboard receive hardware options in the form of printed circuit cards that are plugged directly into one or more of the expansion slots. Each slot includes a connector, or socket (56) on the motherboard into which an expansion card is plugged. To hold the card rigidly in a vertical position each slot also has a card guide slot (58) on a back panel (60).

Input/output (I/O) devices, such as a video monitor, mouse and printer are connected to a back panel of the chassis by means of cables that plug into connectors (62, 63, 64, 65, 67) through access holes in the back panel (60) of the chassis.

In summary, a computer mother board (50) is housed in a chassis (52) that has a number of expansion board guides (58) along a back panel (60) of the chassis and a power supply (61) with a cooling fan. The mother board is rectangular with its short dimension being 8 inches and its long dimension being 13 inches so that it fits into the chassis of existing computers. The motherboard is positioned in the chassis such that the long dimension is along the back panel (60) of the chassis, which means that the motherboard is rotated 90 degrees from the orientation of conventional motherboards. The short dimension at a first edge (70) of the motherboard accommodates a number of expansion card connector sockets (56). A second edge (72) is opposite the first edge. The expansion card connector sockets (56) are perpendicular to the long dimension at a third edge (74) such that the connector sockets are in alignment with the expansion board guides (58) along the back panel (60) of the chassis. A fourth edge (76) is opposite the third edge. A central processing unit socket (54) is located at the second edge (72) near the power supply fan for more efficient cooling. Input/output connectors sockets (62, 63, 64, 65, 67) are located along the third edge (74) such that the input/output connector sockets are in alignment with the openings in the back panel (60) when the mother board is installed in the chassis.

While the invention has been particularly shown and described with reference to preferred embodiments thereof, it will be understood by those skilled in the art that the foregoing and other changes in form and detail may be made therein without departing from the scope of the invention.

What is claimed is:

1. A computer motherboard comprising:

a first edge;

said first edge being of a short dimension;

a second edge opposite said first edge;

a third edge;

said third edge being of a long, straight dimension that is greater than said short dimension;

a fourth edge opposite said third edge;

a number of expansion card connector sockets perpendicular to said third edge, said number of expansion card connector sockets being within a first area of said motherboard, said first area being between said third edge and said fourth edge;

said short dimension being of such a length as to accommodate said number of expansion card connector sockets perpendicular to said third edge along said long, straight dimension; and, a central processing unit located within a second area of said motherboard, said second area being between said first area and said second edge.

2. The computer motherboard in accordance with claim 1 further comprising input/output connector sockets;

said input/output connector sockets being located on said motherboard along said third edge between said first area and said second edge.

3. A computer comprising:

a chassis including a chassis back panel;

a number of expansion card guides along said chassis back panel;

a motherboard in said chassis;

said motherboard having a first edge;

said first edge being of a short dimension;

said motherboard having a second edge opposite said first edge;

said motherboard having a third edge;

said third edge being of a long, straight dimension that is greater than said short dimension;

a number of expansion card connector sockets perpendicular to said third edge;

said short dimension being of such a length as to accommodate said number of expansion card connector sockets perpendicular to said third edge along said long, straight dimension such that said connector sockets are in alignment with said expansion card guides along said chassis back panel; and, a central processing unit socket located on said mother board located between said number of expansion card connector sockets and said second edge.

4. The computer in accordance with claim 3 further comprising:

input/output connector sockets;

said chassis back panel having openings cut therein;

said input/output connector sockets being located on said motherboard along said third edge such that said input/output connector sockets are in alignment with said openings in said chassis back panel.

5. The computer in accordance with claim 3 further comprising:

a power supply connected to said chassis;

said power supply being located adjacent said second edge of said motherboard.

6. The computer in accordance with claim 4 further comprising a power supply connected to said chassis;

said power supply being located adjacent said second edge of said motherboard.

7. A computer comprising:

a chassis including a chassis back panel;

said chassis back panel having openings cut therein;

a number of expansion card guides along said back panel;

a motherboard in said chassis;

said motherboard having a first edge;

said first edge being of a short dimension;

said motherboard having a second edge opposite said first edge;

said motherboard having a third edge;

said third edge being of a long, straight dimension that is greater than said short dimension;

a fourth edge opposite said third edge;

a number of expansion card connector sockets perpendicular to said third edge along said long, straight dimension, said number of expansion card connector sockets being within a first area of said motherboard, said first area being between said third edge and said fourth edge;

said short dimension being of such a length as to accommodate a number of expansion card connector sockets perpendicular to said third edge along said long, straight dimension such that said connector sockets are in alignment with said expansion card guides along said chassis back panel;

a central processing unit socket located on said motherboard within a second area of said motherboard, said second area being between said first area and said second edge;

input/output connector sockets;

said input/output connector sockets being located on said motherboard along said third edge such that said input/output connector sockets are in alignment with said openings in said chassis back panel; and, a power supply connected to said chassis;

said power supply being located adjacent said second edge of said motherboard.

8. The combination in accordance with claim 1 wherein:

said central processing unit is located on said motherboard so as to enable unobstructed insertion of expansion cards in said expansion card connector sockets.

9. The combination in accordance with claim 3 wherein:

said central processing socket is located on said motherboard so as to enable unobstructed insertion of expansion cards in said expansion card connector sockets.

10. The combination in accordance with claim 7 wherein:

said central processing unit socket is located on said motherboard in a position that enables unobstructed insertion of expansion cards in said expansion card connector sockets.

11. The combination in accordance with claim 1 wherein:

said computer chassis includes a cooling fan; and, said central processing socket is located on said motherboard in proximity with said fan.

12. The combination in accordance with claim 1 wherein:

said computer chassis includes a power supply;

said power supply including a cooling fan; and, said central processing socket is located on said motherboard in proximity with said fan.

13. The computer of claim 5 wherein:

said power supply includes a cooling fan;

said cooling fan being positioned with respect said central processing unit socket so as to provide cooling of a central processing unit placed in said central processing unit socket.

14. The computer of claim 6 wherein:

said power supply includes a cooling fan;

said cooling fan being positioned with respect said central processing unit socket so as to provide cooling of a central processing unit placed in said central processing unit socket.

15. The computer of claim 7 wherein:

said power supply includes a cooling fan;

said cooling fan being positioned with respect said central processing unit so as to provide cooling of said central processing unit.

16. A method of constructing a computer motherboard comprising steps of:

A. fabricating a printed circuit board with a first edge of a short dimension, a second edge opposite said first edge, a third edge of a long, straight dimension that is greater than said short dimension and a fourth edge opposite said third edge;

B. installing a number of expansion card connector sockets perpendicular to said third edge along said long, straight dimension, said number of expansion card connector sockets being installed within a first area of said motherboard, said first area being between said third edge and said fourth edge; and, C. installing a central processing unit socket within a second area of said motherboard, said second area being between said first area and said second edge.

17. The computer motherboard in accordance with claim 16 further comprising:

D. cutting openings in said chassis back panel; and,

E. locating input/output connector sockets on said motherboard along said third edge such that said input/ output connector sockets are in alignment with said openings in said chassis back panel.

18. A method of constructing a computer comprising steps of:
   A. fabricating a chassis including a chassis back panel;
   B. placing a number of expansion card guides along said back panel;
   C. fabricating a motherboard having a first edge of a short dimension, a second edge opposite said first edge, a third edge of a long, straight dimension that is greater than said short dimension, and a fourth edge opposite said third edge;
   D. installing said motherboard in said chassis;
   E. placing a number of expansion card connector sockets perpendicular to said third edge along said long, straight dimension such that said connector sockets are in alignment with said slots along said chassis back panel, said number of expansion card connector sockets being installed within a first area of said motherboard, said first area being between said third edge and said fourth edge; and,
   F. installing a central processing unit socket on said motherboard within a second area of said motherboard, said second area being between said first area and said second edge.

19. The method in accordance with claim 18 further comprising steps of:
   G. cutting openings in said chassis back panel;
   H. locating input/output connector sockets on said motherboard along said third edge such that said input/output connector sockets are in alignment with said openings in said chassis back panel.

20. The method in accordance with claim 18 further comprising steps of:
   G. installing a power supply having a cooling fan in said chassis along said second edge of said motherboard.

21. The method in accordance with claim 19 further comprising a step of:
   I. installing a power supply having a cooling fan in said chassis along said second edge of said motherboard.

22. A method of constructing a computer comprising steps of:
   A. fabricating a chassis with a chassis back panel;
   B. cutting openings in said chassis back panel;
   C. installing a number of expansion card guides along said back panel;
   D. placing a motherboard in said chassis;
      said motherboard having a first edge;
      said first edge being of a short dimension;
      said motherboard having a second edge opposite said first edge;
      said motherboard having a third edge;
      said third edge being of a long, straight dimension that is greater than said short dimension;
      said motherboard having a fourth edge opposite said third edge;
   E. installing a number of expansion card connector sockets perpendicular to said third edge along said long dimension, said number of expansion card connector sockets being installed within a first area of said motherboard, said first area being between said third edge and said fourth edge;
   F. installing a central processing unit socket within a second area of said motherboard, said second area being between said first area and said second edge;
   G. locating input/output connector sockets on said motherboard along said third edge such that said input/output connector sockets are in alignment with said openings in said chassis back panel; and,
   H. installing a power supply having a cooling fan in said chassis along said second edge of said motherboard.

\* \* \* \* \*

UNITED STATES PATENT AND TRADEMARK OFFICE
CERTIFICATE OF CORRECTION

PATENT NO. : 5,555,158
DATED : September 10, 1996
INVENTOR(S) : David Dent

It is certified that error appears in the above-indentified patent and that said Letters Patent is hereby corrected as shown below:

On the title page: Item [54] and Column 1, line 2, delete "STANDARD".

Signed and Sealed this

Seventh Day of January, 1997

Attest:

BRUCE LEHMAN

*Attesting Officer*      Commissioner of Patents and Trademarks